United States Patent
Kiffmeyer

[11] 3,992,636
[45] Nov. 16, 1976

[54] DIGITAL INPUT CIRCUIT WITH FAULT DETECTION MEANS

[75] Inventor: William W. Kiffmeyer, Bayside, Wis.

[73] Assignee: Allen-Bradley Company, Milwaukee, Wis.

[22] Filed: Feb. 5, 1976

[21] Appl. No.: 655,456

[52] U.S. Cl. .............................. 307/231; 307/202 R; 307/218; 307/236; 307/261; 307/310; 317/33 R; 340/146.1 AB
[51] Int. Cl.² .................... H03K 5/20; H03K 19/14
[58] Field of Search ........... 307/202, 218, 231, 236, 307/261, 310; 317/33 R; 340/146.1 AB

[56] References Cited
UNITED STATES PATENTS

| | | | |
|---|---|---|---|
| 3,408,507 | 10/1968 | Martin | 307/202 |
| 3,491,302 | 1/1970 | Madsen et al. | 307/231 |
| 3,691,403 | 9/1972 | Newmeyer | 307/231 |
| 3,743,855 | 7/1973 | Struger | 307/218 |
| 3,751,684 | 8/1973 | Struger | 307/218 |

Primary Examiner—Stanley D. Miller, Jr.
Attorney, Agent, or Firm—Quarles & Brady

[57] ABSTRACT

The state of a sensing device such as a switch is indicated as a logic signal at a circuit output terminal and a malfunction is indicated at another circuit output when the connections to the sensing device open circuit or short circuit. The input circuit employs a pair of LED photo-isolators which conduct during alternate half cycles of an a-c current which is applied through the sensing device when it is closed. A diode connects in shunt with the sensing device and when the device is open, only one of the photo-isolators conducts. If a malfunction occurs, neither photo-isolator conducts.

6 Claims, 1 Drawing Figure

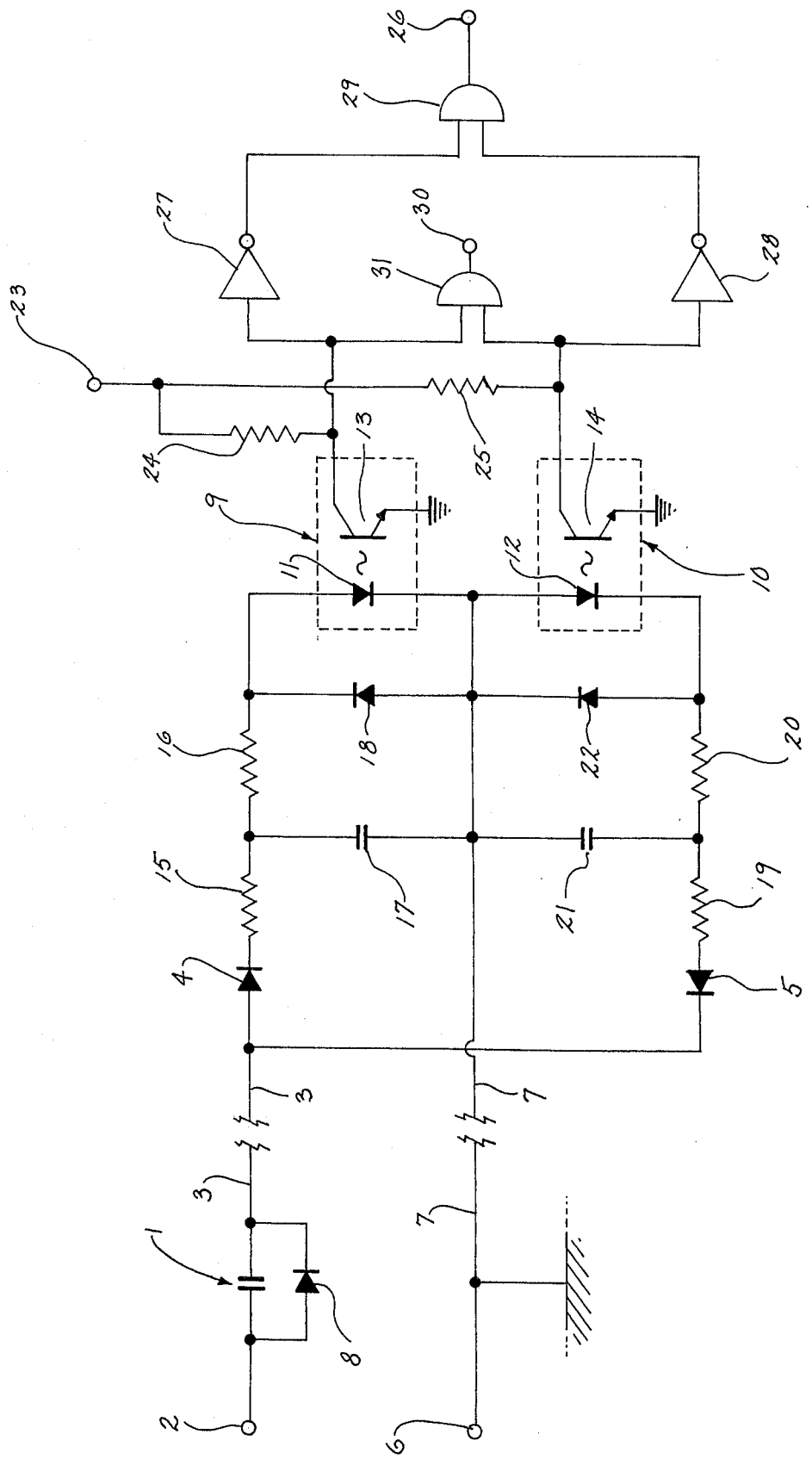

DIGITAL INPUT CIRCUIT WITH FAULT DETECTION MEANS

BACKGROUND OF THE INVENTION

The field of the invention is input circuits for industrial digital controllers, and particularly, circuits for interfacing sensing devices such as limit switches, selector switches, solenoids and photoelectric cells with digital equipment such as process controllers, programmable controllers, solid state hardwired controllers and numerical controls.

Industrial digital controllers include a network of logic gates having inputs connected to receive signals from sensing devices such as limit switches, solenoids, photoelectric cells, pushbuttons, etc., and having outputs connected to control the various machine functions in response to the condition of the sensing devices. The logic gates used in such controllers may include AND gates, NAND gates, OR gates, NOR gates and NOT gates. Regardless of the number of gates, the type of gates or their interconnection, they are each responsive to generate either a logic high or a logic low at an output terminal in response to the logic state of their input terminal(s). For example, an AND gate generates a logic high at its output terminal when logic highs are applied to all of its input terminals; otherwise, its output is low.

Logic gates, and digital circuits in general, do not recognize or interpret malfunctions at their input terminals, but instead, interpret them as either a logic high or a logic low. For example, if "current sinking" logic gates are used in a solid state hardwired controller, and an open circuit occurs in the line leading from a limit switch on the machine being controlled, the open circuit will be interpreted as a logic high by the gate which connects to that limit switch. On the other hand, if the line leading from the same limit switch should become shorted to ground, the logic gate may interpret the short circuit as a logic low voltage. Therefore, when such a malfunction occurs the logic gate and associated circuitry respond in a manner not indicated by the sensing device. Also, in such circumstances there is no indication that a malfunction has occurred and the controller continues to operate on erroneous input information.

Means have been proposed for detecting malfunction conditions at the inputs to a logic gate. One such means is the "Fault Detecting and Fault Propagating Logic Gate" disclosed in U.S. Pat. No. 3,743,855 issued to Odo J. Struger on July 3, 1973. Also, control circuits employing such fault mode logic gates have been proposed as disclosed in U.S. Pat. No. 3,751,684, which also issued to Odo J. Struger on Aug. 7, 1973.

SUMMARY OF THE INVENTION

The present invention relates to a digital input circuit which connects to a sensing device to indicate the state of the device at a circuit output terminal and which indicates a malfunction at a second output terminal when an open circuit or short circuit occurs in the connections to the sensing device. More particularly, the input circuit includes a diode connected in shunt with the sensing device and having one lead connected to one terminal on a source of alternating current, a first rectifier diode having its anode connected to the other lead on the shunt diode, a second rectifier diode having its cathode connected to the other lead on the shunt diode, first current sensing means connected in series circuit with the cathode of the first rectifier diode and the other terminal on the source of alternating current, second current sensing means connected in series circuit with the anode of the second rectifier diode and the other terminal on the source of alternating current, first gate means having inputs connected to the respective current sensing means and having an output, the first gate means being responsive to the presence of current flowing in both of the current sensing means to generate a selected logic signal at the circuit output terminal, and second gate means having inputs connected to the respective current sensing means and having an output, the second gate means being responsive to the absence of current flow in both of the current sensing means to generate a selective logic signal at its output.

When the sensing device is closed, or in its low impedance state, current is conducted through it in both directions and it flows through both current sensing means. As a result, the first gate means is enabled and the selected logic state is generated at the circuit output terminal. When the sensing device is open, or in its high impedance state, current flows only in one direction through the shunt diode and, therefore, it flows through only one of the current sensing means. As a result, the first gate means is not responsive and the circuit output terminal assumes another logic state. If a malfunction should occur which interrupts current flow between the sensing device and the rectifier diodes, neither current sensing means will be operated and the second gate means will respond to generate a logic signal at its output terminal. This logic signal indicates that a malfunction has occurred and may be employed in a number of ways to shut down the controller, sound an alarm, and identify the particular device involved.

The general object of the invention is to provide means for indicating the presence of an open circuit or a short circuit to ground in the connections to a digital controller. By employing the circuit of the present invention at the inputs to the controller, the condition of the connections between the controller and remotely located sensing devices can be continuously monitored. The malfunction indicating output terminals on each circuit can be combined on a common bus which connects to an alarm or to controller disabling circuitry. In the alternative, the fault indicating output on each input circuit can be separately monitored to provide not only a malfunction indication, but also, an indication of the particular sensing device involved.

Another object of the invention is to provide a digital input circuit which is comprised of reliable and inexpensive components. It can be appreciated that digital controllers may include hundreds or even thousands of input circuits and that complex and expensive circuit arrangements are not economically feasible.

Other objects and advantages of the invention will become apparent from the description to follow. In the description reference is made to the accompanying drawing which forms a part hereof and in which there is shown by way of illustration a preferred embodiment of the invention. Such embodiment does not necessarily represent the scope of the invention, and reference is made to the claims herein for interpreting the breadth of the invention.

BRIEF DESCRIPTION OF THE DRAWING

FIG. 1 is an electrical schematic diagram of the preferred embodiment of the invented digital input circuit.

DESCRIPTION OF THE PREFERRED EMBODIMENT

The sensing device to which the input circuit is connected is illustrated in FIG. 1 by a set of normally open contacts 1 which may, for example, be the contacts in a limit switch, selector switch or pushbutton switch. One contact connects to one terminal 2 of an alternating current source and the other contact connects to the input circuit through a lead 3. The contacts 1 are typically located some distance from the controller which incorporates the input circuit and the lead 3, therefore may extend over a considerable distance. A second lead 7 accompanies the lead 3 and connects a second terminal 6 on the alternating current source to the input circuit ground. Preferably, the lead 7 is connected to ground at the machine being controlled and it serves as a common ground for a number of sensing devices mounted on the machine.

A diode 8 is connected in shunt with the contacts 1 to provide a parallel branch which conducts current in one direction when the contacts 1 are open. The orientation, or direction, of the diode 8 is of no importance to the operation of the circuit. The diode 8 is functionally a part of the digital input circuit although it is physically located with the sensing device. Indeed, as will become apparent from the description which follows, it is important that the diode 8 be physically connected as close as possible to the contacts 1. For example, if the contacts 1 are located in the housing of a limit switch, the shunt diode 8 should also be located within the protective housing.

The lead 3 connects to the anode of a first rectifier diode 4 and the cathode of a second rectifier diode 5 in the input circuit. The rectifier diode 4 is connected in series circuit with a first current sensing device 9 indicate generally at 9 to conduct positive current from the lead 3 to the lead 7. The second rectifier diode 5 is connected in series circuit with a second current sensing device 10 to conduct positive current in the opposite direction, from the lead 7 to the lead 3. In other words, the series branches are conductive on alternate half cycles of the applied alternating current. The current sensing devices 9 and 10 are light emitting diode photo-isolators which include respective diode portions 11 and 12 and respective transistor portions 13 and 14. An emitter on each transistor portion connects to circuit ground and a collector on each connects to a positive d-c supply terminal 23 through respective load resistors 24 and 25. When current flows through the diode portions 11 and 12 the transistor portions 13 and 14 become conductive and their collector voltage drops from a logic high voltage to a logic low voltage.

The rectifier diode 4 provides current to the diode portion 11 of the photo-isolator 9 through a pair of series connected resistors 15 and 16. A charging capacitor 17 connects between the lead 7 and the juncture of the resistors 15 and 16 and a diode 18 is connected across the diode portion 11 to conduct in the opposite direction. Similarly, a pair of resistors 19 and 20 connect the second rectifier diode 5 to the diode portion 12 of the photo-isolator 10 and a charging capacitor 21 connects to their juncture. A diode 22 is connected across the diode portion 12 to conduct current in the opposite direction.

When the contacts 1 are closed, current alternately flows through the rectifier diodes 4 and 5 from the alternating current supply terminals 2 and 6. Current flow through the diode 4 charges the capacitor 17 to provide a relatively constant current flow through the diode portion 11 of the first current sensing device 9. The resistor 16 decouples the capacitor 17 from the low forward voltage across the diode portion 11 to allow it to charge to a higher voltage. Similarly, current flow through the second rectifier diode 5 during alternate half cycles charges the capacitor 21 to a voltage which provides a relatively constant current flow through the diode portion 12 of the second current sensing device 10. As a result, when the contacts 1 are closed, both current sensing devices 9 and 10 are energized and both of their transistor portions 13 and 14 are conductive.

When the contacts 1 are open, current flows through the shunt diode during alternate half cycles and this current is applied to the charging capacitor 17 by the first rectifier diode 4. The diode portion 11 on the first current sensing device 9 is thus conductive when the contacts 1 are open and the collector element of its transistor portion 13 is at a logic low voltage. The shunt diode 8 blocks current flow in the reverse direction and thus no current flows through the series branch which includes the second diode portion 12 and the second rectifier diode 5. As a result, the second current sensing device 10 is deenergized and its collector element is at a logic high voltage when the contacts 1 are open. It should be apparent that by reversing the direction of the shunt diode 8 the first current sensing element 9 becomes deenergized and the second current sensing element 10 becomes energized. Therefore, regardless of the direction of the shunt diode 8, one transistor portion 13 or 14 is conductive and the other is nonconductive when the contacts 1 are open.

In the event that an open circuit should occur in the lead 3 or the lead 7, or in the event a short circuit should occur between the leads 3 and 7, no current will flow through either of the rectifier diodes 4 or 5. As a result, neither current sensing device 9 or 10 is energized and the collectors on both transistor portions 13 and 14 are at a logic high voltage.

The collectors on the current sensing devices 9 and 10 are coupled to a circuit output terminal 26 by first gate means which is comprised of a pair of inverter gates 27 and 28 and an AND gate 29. More specifically, the collector of transistor portion 13 connects to the input of inverter gate 27 and the collector of transistor portion 14 connects to the input of inverter gate 28. The output of inverter gate 27 connects to one input on the AND gate 29 and the output of the other inverter gate 28 connects to a second input on the AND gate 29. The output of the AND gate 29 serves as the circuit output terminal 26. As described above, when the contacts 1 are closed, both transistor portions 13 and 14 are conductive and their collectors are driven to a logic low voltage. The inverter gates 27 and 28 receive the logic low voltages and invert them to apply logic high voltages to both inputs of the AND gate 29. As a result, a logic high voltage is indicated at the circuit output terminal 26. When the contacts 1 are open, one of the transistor portions 13 or 14 is conductive and the other is nonconductive. Consequently, a logic high voltage is applied to one input of the AND gate 29 and a logic low voltage is applied to the other. A logic low voltage is thus generated at the circuit output terminal 26.

The collectors on the current sensing elements 9 and 10 are also coupled to a malfunction indicate terminal 30 by second gate means which is comprised of an AND gate 31. More specifically, the collector of transistor portion 13 connects to one input on the AND gate 31, the collector on the transistor portion 14 connects to a second input on the AND gate 31 and the output of the AND gate 31 serves as the malfunction indicate terminal 30. When a malfunction occurs which results in neither current sensing device 9 or 10 becoming energized, the collectors of both transistor portions 13 and 14 are pulled to a logic high voltage by the load resistors 24 and 25 and the AND gate 31 is enabled to generate a logic high voltage at the malfunction indicate terminal 30. As indicated above, such a malfunction occurs when either or both of the leads 3 and 7 becomes open circuited or when they short circuit to one another. Under normal operating conditions, as described above, one or both of the collectors on the transistor portions 13 and 14 are at a logic low voltage and the AND gate 31 is disabled.

It should be apparent to those skilled in the art that a number of variations can be made in the preferred embodiment described herein without departing from the spirit of the invention. For example, current sensors other than LED photo-isolators described herein can be employed. The LED photo-isolators are preferred, however, because they provide electrical isolation in addition to the described current sensing function. Other logic gates may also be employed. For example, NAND gates may be substituted for the AND gates 29 or 31 to reverse the logic states applied to the output terminals 26 and 30. Also, some elements such as the diodes 18 and 22 may be eliminated, since the diodes 18 and 22 serve only to protect the diode portions 11 and 12 of the current sensors 9 and 10 from excessive reverse voltages. Such protection may not be necessary when other type of current sensing devices are used. Also, it should be apparent that although the described preferred embodiment is formed from discrete components, many or all of these components may be incorporated into one or more integrated circuits.

I claim:
1. In an input circuit for indicating the state of a sensing device, the combination comprising:
   a diode connected in shunt with said sensing device and having one lead connected to one terminal of an alternating current source;
   a first rectifier diode having its anode coupled to the other lead on said shunt diode;
   a second rectifier diode having its cathode coupled to said other lead on said shunt diode;
   first current sensing means connected in series with said first rectifier diode to form a first branch which connects to the other terminal on said source of alternating current, said first current sensing means being operable to generate a selected logic signal at an output when said first rectifier diode conducts current;
   second current sensing means connected in series, said second rectifier diode to form a second branch which connects to said other terminal on said source of alternating current, said second current sensing means being operable to generate a selected logic signal at its output when said second rectifier diode conducts current;
   first gate means having inputs connected to the respective current sensing means outputs and having an output terminal, said first gate means being responsive to the presence of said selected logic signal at the outputs of both said current sensing means to generate a selected logic signal at its output; and
   second gate means having inputs connected to the respective current sensing means outputs and having an output, said second gate means being responsive to the absence of said selected logic signal at the outputs of both said current sensing means to generate a selected logic signal at its output.

2. The input circuit as recited in claim 1 in which each of said current sensing means are light emitting diode photo-isolators having a diode portion connected in series circuit with its associated rectifier diode and having a transistor portion which connect to said first and second gate means.

3. The input circuit as recited in claim 2 in which a resistor is connected in series with each of said diode portions of said current sensing means and charging capacitors are connected in parallel with each of said diode portions and resistor.

4. The input circuit as recited in claim 3 in which second resistors are connected in series with each of said rectifier diodes.

5. The input circuit as recited in claim 2 in which each transistor portion of the current sensing means includes an emitter which connects to a logic low voltage source and a collector which couples to a logic high voltage source through a load resistor.

6. The input circuit as recited in claim 1 in which said first gate means includes an AND gate having first and second inputs which couple to the respective current sensing means outputs, and said second gate means includes an AND gate having a pair of inputs also coupled to the respective first and second current sensing means outputs.

* * * * *